(12) United States Patent
Lee et al.

(10) Patent No.: US 8,056,032 B2
(45) Date of Patent: Nov. 8, 2011

(54) METHODS FOR MEASURING MEAN-TO-TARGET (MTT) BASED ON PATTERN AREA MEASUREMENTS AND METHODS OF CORRECTING PHOTOMASKS USING THE SAME

(75) Inventors: Hyung-joo Lee, Gyeonggi-do (KR); So-yoon Bae, Gyeonggi-do (KR); Yo-han Choi, Gyeonggi-do (KR); Jong-won Kim, Gyeonggi-do (KR); Dong-hoon Chung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 444 days.

(21) Appl. No.: 12/276,526

(22) Filed: Nov. 24, 2008

(65) Prior Publication Data
US 2009/0150849 A1    Jun. 11, 2009

(30) Foreign Application Priority Data

Dec. 7, 2007    (KR) .......................... 10-2007-0126849

(51) Int. Cl.
*G06F 17/50*    (2006.01)

(52) U.S. Cl. .............. 716/106; 716/50; 716/51; 716/52; 716/53; 716/54; 716/55; 716/107; 716/111; 430/5; 430/30

(58) Field of Classification Search .............. 716/50–55, 716/106–107, 111; 430/5, 30
See application file for complete search history.

(56) References Cited

U.S. PATENT DOCUMENTS

| | | | | |
|---|---|---|---|---|
| 6,760,892 B2 * | 7/2004 | Taoka et al. | ...................... | 716/53 |
| 7,303,845 B2 * | 12/2007 | Okada et al. | ...................... | 430/30 |
| 7,752,584 B2 * | 7/2010 | Yang | ............................... | 716/52 |
| 7,805,699 B2 * | 9/2010 | Kusnadi et al. | .................. | 716/51 |
| 2003/0054642 A1 * | 3/2003 | Kagotani et al. | .............. | 438/689 |

FOREIGN PATENT DOCUMENTS

| | | |
|---|---|---|
| KR | 1020050000332 A | 1/2005 |
| KR | 1020050024668 A | 3/2005 |
| KR | 1020060099708 A | 9/2006 |

\* cited by examiner

*Primary Examiner* — Nghia Doan
(74) *Attorney, Agent, or Firm* — Myers Bigel Sibley & Sajovec (57) ABSTRACT

Methods of measuring a mean-to-target (MTT) based on pattern area measurements are provided including providing a design pattern. A plurality of design pattern measurements are measured for calculating an area of the design pattern based on a shape of the design pattern. A series of calculation measurements are calculated by continuously substituting a same variation into the design pattern measurements, and calculating a series of calculation areas corresponding respectively to the calculation measurements to generate a database including the calculation measurements and the calculation areas. An actual pattern is formed using the design pattern and an area of the actual pattern is measured. A calculation area corresponding to the area of the actual pattern is selected from the database and calculation measurements corresponding to the calculation area are selected. A difference between the design pattern measurements and the calculation measurements is calculated and the difference is set as an MTT. Related methods of correcting a photomask are also provided herein.

20 Claims, 5 Drawing Sheets

METHODS FOR MEASURING MEAN-TO-TARGET (MTT) BASED ON PATTERN AREA MEASUREMENTS AND METHODS OF CORRECTING PHOTOMASKS USING THE SAME

CLAIM OF PRIORITY

This application claims priority to Korean Patent Application No. 10-2007-0126849, filed on Dec. 7, 2007 in the Korean Intellectual Property Office, the disclosure of which is incorporated herein in its entirety by reference.

FIELD OF THE INVENTION

The present invention relates semiconductor devices and, more particularly, to methods of correcting a photomask.

BACKGROUND OF THE INVENTION

As the integration density of semiconductor devices has increased, the width of patterns formed on a semiconductor substrate and an interval between the patterns have been decreased. Formation of photomasks is indispensable when manufacturing semiconductor devices. The photomask includes a mask pattern defining a variety of elements. The size of the mask patterns continue to get smaller to provide smaller, highly integrated devices. Since a high-quality photomask is difficult to obtain and manufacturing costs of the photomask continue to increase, it may be important to obtain the high-quality photomask early in view of the photomask manufacturing cost and a turn-around time (TAT) reduction.

When the size of the mask pattern gets so small as to reach resolution limit of the exposure tool, it is difficult to transfer on the electronic device substrate a pattern of the same shape and CD that correspond to the mask pattern formed on the photomask due to an optical proximity effect. In order to form a high-resolution pattern with a linewidth smaller than the wavelength of light, an optical proximity correction (OPC) technique for correcting the shape of the photomask beforehand is used in consideration of deformation of a pattern formed on a wafer due to the optical proximity effect.

Recently, a design rule has continuously decreased in order to improve the performance of transistors and produce more chips with respect to net die standard. With the shrinkage of the linewidth of gate patterns, the dependence of the linewidth of the gate patterns on the dimension of a space between adjacent gate patterns becomes strongly marked, so that it becomes difficult to control the linewidth of the gate patterns. Accordingly, it mat be very important to elevate the accuracy of a photomask in order to satisfy a strict target value of an after development inspection (ADI) critical dimension (CD). Also, it becomes stricter to control a mask mean-to-target (MTT) and CD uniformity.

Furthermore, the so-called "peanuts" effect occurs due to the optical proximity effect so that an outer portion of a pattern is curved, and patterns having shapes that cannot ensure an MTT using conventional one-dimensional measurement methods are increasing. To address these problems, a method of measuring the area of a pattern has been proposed. However, it may be necessary to develop a method of converting the measured area of the pattern into conventional one-dimensional MTT.

SUMMARY OF THE INVENTION

Some embodiments of the present invention provide methods of measuring a mean-to-target (MTT) based on pattern area measurements including providing a design pattern. A plurality of design pattern measurements are measured for calculating an area of the design pattern based on a shape of the design pattern. A series of calculation measurements are calculated by continuously substituting a same variation into the design pattern measurements, and calculating a series of calculation areas corresponding respectively to the calculation measurements to generate a database including the calculation measurements and the calculation areas. An actual pattern is formed using the design pattern and an area of the actual pattern is measured. A calculation area corresponding to the area of the actual pattern is selected from the database and calculation measurements corresponding to the calculation area are selected. A difference between the design pattern measurements and the calculation measurements is calculated and the difference is set as an MTT.

In further embodiments of the present invention, calculating the series of calculation measurements may include continuously increasing or decreasing all the design pattern measurements at the same variation. The variation and a range of the variation may be determined according to a grid of the design pattern. In still further embodiments of the present invention, selecting the calculation area may include selecting a calculation area that is most approximate to the area of the actual pattern.

In some embodiments of the present invention, the design pattern may include a polygonal shape and/or a curved surface shape. In certain embodiments, the design pattern may be a triangular shape, a rectangular shape, a square shape, a parallelogram shape, a lozenge shape, a trapezoidal shape, a semicircular shape, a circular shape and/or an elliptical shape.

In further embodiments of the present invention, providing the design pattern may include providing an initial design pattern; separating the initial design pattern into a plurality of temporary design patterns, each temporary design pattern including a triangular shape, a rectangular shape, a square shape, a parallelogram shape, a lozenge shape, a trapezoidal shape, a semicircular shape, a circular shape and/or an elliptical shape; and selecting one of the plurality of temporary design patterns as the design pattern. In certain embodiments, selecting one of the plurality of temporary design patterns as the design pattern may include selecting a temporary design pattern having a largest area as the design pattern.

In still further embodiments of the present invention, the actual pattern may include a photoresist pattern, a hard mask pattern and/or an aerial image emulating pattern. Some embodiments of the present invention provide methods of correcting a photomask, the method including providing an application photomask layout including at least one design pattern. The at least one design pattern is provided and a plurality of design pattern measurements are measured for calculating an area of the design pattern according to a shape of the design pattern. A series of calculation measurements are calculated by continuously substituting a same variation into the design pattern measurements, and calculating a series of calculation areas corresponding respectively to the calculation measurements to generate a database including the calculation measurements and the calculation areas. An actual pattern is formed using the design pattern of the application photomask layout. The area of the actual pattern is measured and a calculation area corresponding to the area of the actual pattern is selected from the database and selecting calculation measurements corresponding to the calculation area. A difference between the design pattern measurements and the calculation measurements are calculated and the difference is set as an MTT. The design patterns of the application photomask are corrected using the MTT to form a correction photomask layout.

DETAILED DESCRIPTION OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes or configurations of elements may be idealized or exaggerated for clarity.

It will be understood that when an element is referred to as being "connected to" or "coupled to" another element, it may be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components and/or sections, these elements, components and/or sections should not be limited by these terms. These terms are only used to distinguish one element, component, or section from another element, component or section. Thus, a first element, component or section discussed below could be termed a second element, component or section without departing from the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

Example embodiments are described below with reference to block diagrams and/or flowchart illustrations of methods, devices, systems and/or computer program products. It is understood that a block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means (functionality) and/or structure for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the functions/acts specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, example embodiments may be implemented in hardware and/or in software (including firmware, resident software, micro-code, etc.). Furthermore, example embodiments may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Computer program code for carrying out operations of data processing systems discussed herein may be written in a high-level programming language, such as Java, AJAX (Asynchronous JavaScript), C, and/or C++, for development convenience. In addition, computer program code for carrying out operations of example embodiments may also be written in other programming languages, such as, but not limited to, interpreted languages. Some modules or routines may be written in assembly language or even micro-code to enhance performance and/or memory usage. However, embodiments are not limited to a particular programming language. It will be further appreciated that the functionality of any or all of the program modules may also be implemented using discrete hardware components, one or more application specific integrated circuits (ASICs), or a programmed digital signal processor or microcontroller.

It should also be noted that in some alternate implementations, the finctions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Figure 1:
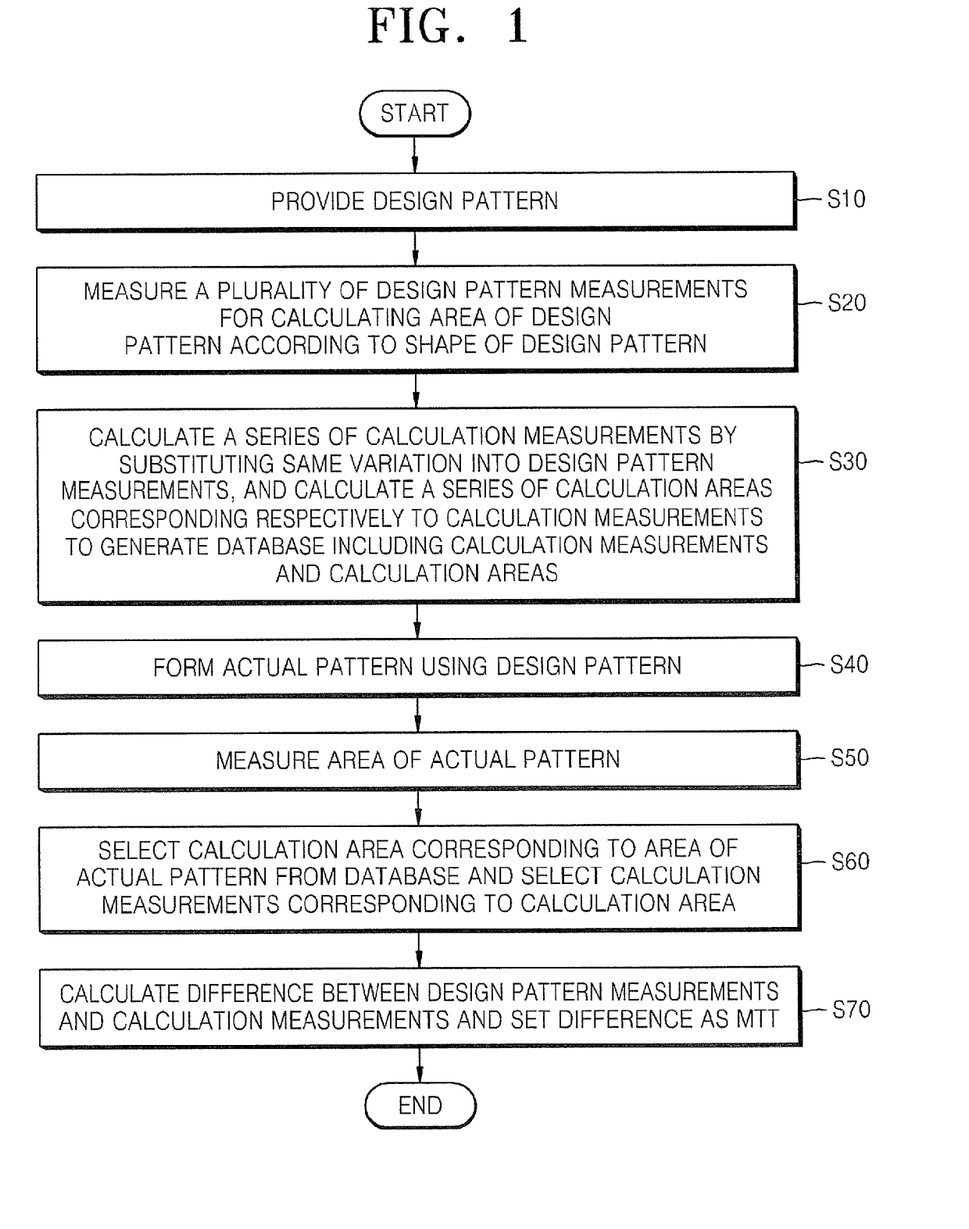
FIG. 1 is a flowchart illustrating methods of measuring a mask mean-to-target (MTT) based on pattern area measurement according to some embodiments of the present invention.

Some embodiments of the present invention will now be discussed with respect to FIGS. 1 through 6. Referring first to FIG. 1, a flowchart illustrating methods of measuring a mask mean-to-target (MTT) based on pattern area measurement according to some embodiments of the present invention will be discussed. As illustrated in FIG. 1, operations begin at block S10 by providing a design pattern. The design pattern may be a pattern included in a photomask layout and have a polygonal shape, a curved surface shape, or a combination thereof. For example, the design pattern may have a triangular shape, a rectangular shape, a square shape, a parallelogram shape, a lozenge shape, a trapezoidal shape, a semicircular shape, a circular shape, an elliptical shape, or any combination thereof.

According to the shape of the design pattern, a plurality of design pattern measurements for calculating the area of the design pattern are measured (block S20). For example, when the design pattern has a rectangular shape, the width and height of the rectangle become the design pattern measurements. Furthermore, when the design pattern has a trapezoidal shape, the upper and lower bases and height of the trapezoid become the design pattern measurements. Similarly, when the design pattern has an elliptical shape, long and short radii of the ellipse become the design pattern measurements. Geometrical elements used for obtaining the areas of various polygons and curved surface shapes may be the design pattern measurements.

A rectangular pattern that is 800 nm wide and 200 nm high will now be discussed below to provide an example. However, it will be understood that embodiments of the present invention are not limited to the rectangular pattern discussed in the example. A series of calculation measurements are obtained by continuously substituting the same variation into the design pattern measurements, and a series of calculation areas corresponding respectively to the calculation measurements are calculated, so that a database including the calculation measurements and the calculation areas is generated (block S30). The operations of block S30 will now be described in more detail. The same variation is continuously substituted into the design pattern measurements, thereby calculating a series of calculation measurements. For instance, all the design pattern measurements may be continuously increased or decreased at the same variation. For example, a rectangular pattern may have a first design pattern measurement of 800 nm and a second design pattern measure of 200 nm. Thus, when the first and second design pattern measurements are increased at a variation of 5.0 nm, the first and second design pattern measurements may be (800, 200), (805, 205), (810, 210), (815, 215) and so on. Furthermore, when the first and second design pattern measurements are decreased at a variation of 5.0 nm, the first and second design pattern measurements may be (800, 200), (795, 195), (790, 190), (785, 185) and so on. In these embodiments, the numbers in parentheses refer to the first design pattern measurement and the second design pattern measurement, respectively. The variation of 5.0 nm is provided for example only and, therefore, embodiments of the present invention are not limited thereto. For example, the variation of the design pattern measurements and the range of the variation may be determined according to the grid of the design patterns. For example, each of the design pattern measurements may vary in the range of 0.1 to 1.0 nm, 1.0 to 10 nm, or 10 to 100 nm or in the range of 0.1 nm or less or in the range of 100 nm or more.

A series of calculation areas corresponding respectively to the calculation measurements are calculated. When the design pattern measurements are increased at a variation of 5.0 nm, the calculation areas may be 160000, 165025, 170100, 175225, and so on. When the design pattern measurements are decreased at a variation of 5.0 nm, the calculation areas may be 160000, 155025, 150100, 145225, and so on. After that, the database including the calculation measurements and the calculation areas is generated. An example of the database is partially shown in Table 1.

TABLE 1

| Calculation measurements of first design pattern measurement | Calculation measurements of second design pattern measurement | Calculated areas |
|---|---|---|
| ... | ... | ... |
| ... | ... | ... |
| 850 | 250 | 242500 |
| 845 | 245 | 207025 |
| 840 | 240 | 201600 |
| 835 | 235 | 196225 |

TABLE 1-continued

| Calculation measurements of first design pattern measurement | Calculation measurements of second design pattern measurement | Calculated areas |
|---|---|---|
| 830 | 230 | 190900 |
| 825 | 225 | 185625 |
| 820 | 220 | 180400 |
| 815 | 215 | 175225 |
| 810 | 210 | 170100 |
| 805 | 205 | 165025 |
| 800 | 200 | 160000 |
| 795 | 195 | 155025 |
| 790 | 190 | 150100 |
| 785 | 185 | 145225 |
| 780 | 180 | 140400 |
| 775 | 175 | 135625 |
| 770 | 170 | 130900 |
| 765 | 165 | 126225 |
| 760 | 160 | 121600 |
| 755 | 155 | 117025 |
| 750 | 150 | 112500 |

Table 1 illustrates an embodiment where the first design pattern measurement is 800, the second design pattern measurement is 200, and the first and second design pattern measurements are increased or decreased at a variation of 5.0. It will be understood that embodiments of the present invention are not limited to these measurements or variation. Specifically, numerical values of the first and second design pattern measurements may be different from each other and increased or decreased not at the same variation, but at the same variation ratio. For example, when the first design pattern measurement is 800 and the second design pattern measurement is 200, while the first design pattern measurement is reduced by 5% (i.e., by 40), the second design pattern measurement may be reduced by 5% (i.e., by 10). Also, since each of the first and second design pattern measurements corresponds to the length or width of the pattern, the lower limit of each of the calculation measurements included in the database typically should exceed 0. Furthermore, the upper limit of each of the calculation measurements included in the database should be appropriate for a pattern of a microelectronic device, for example, in the range of from about 2000 to about 3000.

An actual pattern is formed using the design pattern (S40). The actual pattern may be one of a photoresist pattern, a hard mask pattern, and an aerial image emulating pattern. The photoresist pattern may be formed of an ordinary photoresist material, and the hard mask pattern may be formed of, for example, silicon oxide or silicon nitride. The aerial image pattern is typically an image formed on photoresist. The aerial image emulating pattern is formed using a serial image emulator without performing an exposure process. For example, the aerial image emulator may be an aerial image measurement system (AIMS) by Carl Zeiss or a mask inspection tool.

The area of the actual pattern is measured using methods known to those having skill in the art (block S50). A calculation area corresponding to the area of the actual pattern is selected from the database, and calculation measurements corresponding to the calculation area are selected (block S60). A difference between the design pattern measurements and the calculation measurements is calculated and set as an MTT (block S70)

Details with respect to operations of blocks S50 to S70 will be discussed with reference to Table 1. When the measured area of the actual pattern is 121600, it can be seen that the first calculation measurement is 760 and the second calculation measurement is 160 from the database shown in Table 1. Since the first and second design pattern measurements are 800 and 200, respectively, an MTT obtained by subtracting 760 from 800 (or by subtracting 160 from 200) is 40. If the measured area (e.g., 122000) of the actual pattern is not equal to each of a series of calculation areas of the database shown in FIG. 1, a calculation area that is the most approximate to the area of the actual pattern is selected. A method of selecting an approximate value may be performed using, for example, numerical analysis.

Figure 2:
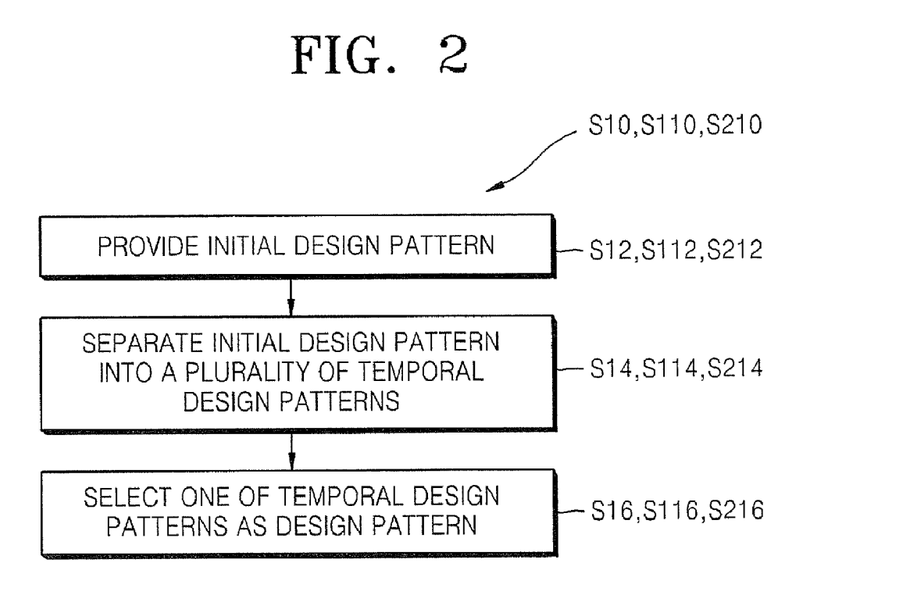
FIG. 2 is a flowchart illustrating exemplary processes for providing a design pattern shown in FIG. 1 according to some embodiments of the present invention.

Referring now to FIG. 2, a flowchart illustrating operations of block S10 for providing the design pattern shown in FIG. 1 when the design pattern has a relatively complicated shape in accordance with some embodiments of the present invention will be discussed. Referring now to FIG. 2, an initial design pattern S12 is provided in by operations of block S12. In operations of block S14, the initial design pattern is separated into a plurality of temporary design patterns, each of which has one shape selected from the group consisting of a triangular shape, a rectangular shape, a square shape, a parallelogram shape, a lozenge shape, a trapezoidal shape, a semicircular shape, a circular shape, an elliptical shape or any combination thereof. In operations of block S16, one of the plurality of temporary design patterns is selected and provided as a design pattern. Furthermore, operations of block S16, a temporary design pattern having the largest area may be selected out of the plurality of temporary design patterns as the design pattern. Thus, an MTT may be approximately obtained using even a design pattern with a relatively complicated shape.

Figure 3:
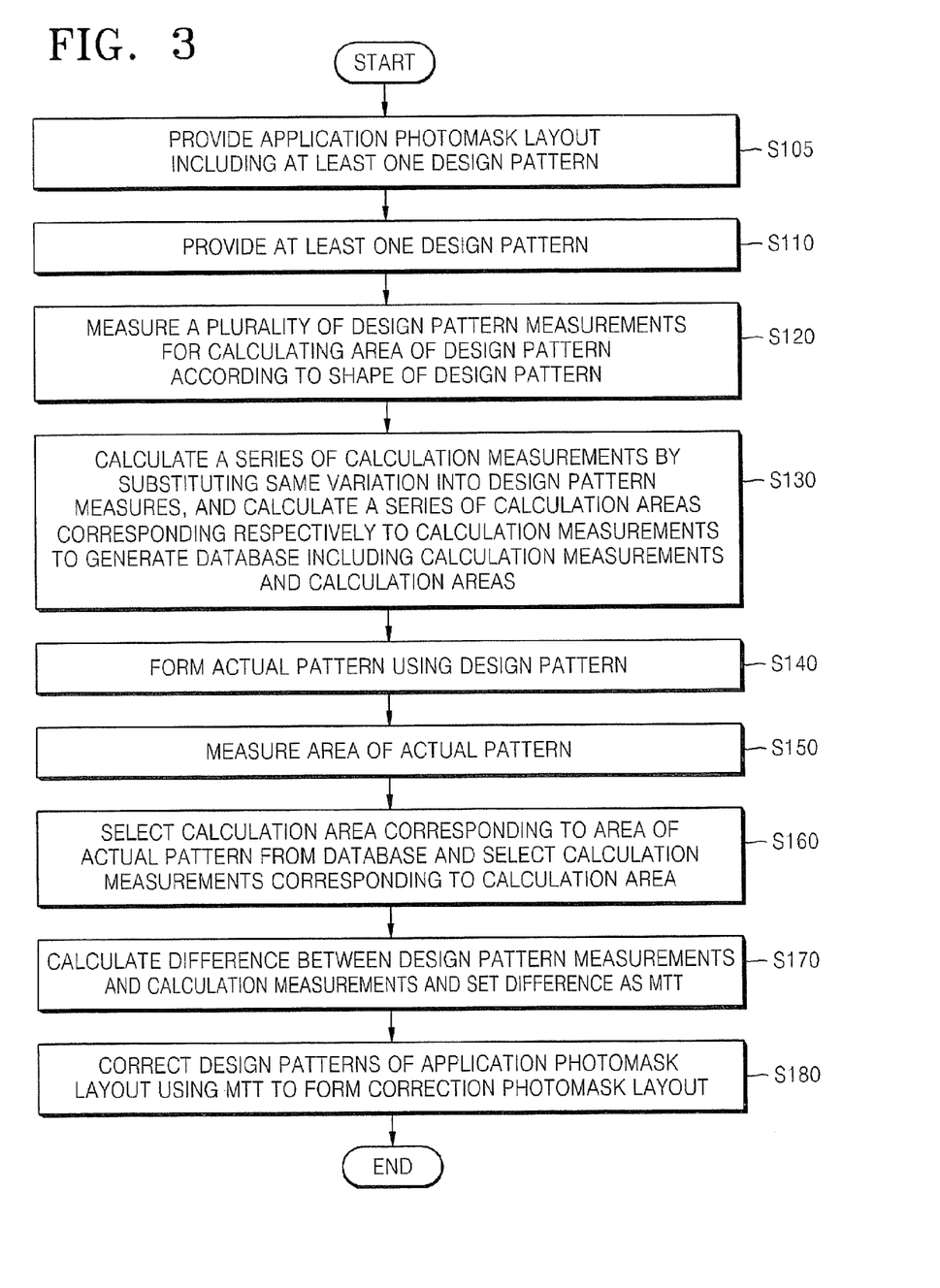
FIG. 3 is a flowchart illustrating methods of correcting a photomask according to some embodiments of the present invention.

Referring now to the flowchart of FIG. 3, methods of correcting a photomask according to some embodiments of the present invention. Since the method of correcting the photomask according to some embodiments of the present invention is performed using the above-described method of measuring an MTT, a repeated description will be omitted for brevity.

Hereinafter, respective operations of methods of correcting the photomask according to some embodiments of the present invention will be discussed with respect to FIG. 3. In operations of block S105, an application photomask layout including at least one design pattern is provided. Thereafter, the at least one design pattern is provided in operations of block S110. The design pattern may be a pattern included in the photomask layout and have one shape including a polygonal shape, a curved surface shape or a combination thereof. For example, the design pattern may have a shape including a triangular shape, a rectangular shape, a square shape, a parallelogram shape, a lozenge shape, a trapezoidal shape, a semicircular shape, a circular shape, an elliptical shape, or any combination thereof.

A plurality of design pattern measurements used for calculating the area of the design pattern are measured according to the shape of the design pattern in operations of block S120. The design pattern measurements are the same as described with reference to FIG. 1.

A series of calculation measurements are obtained by continuously substituting the same variation into the design pattern measurements, and a series of calculation areas corresponding respectively to the calculation measurements are calculated, so that a database including the calculation measurements and the calculation areas is generated in operations of block S130. The operation of obtaining the calculation measurements may be performed by continuously increasing or decreasing all the design pattern measurements at the same variation. Also, the variation of the design pattern measurements and the range of the variation may be determined according to the grid of the design pattern. For example, each of the design pattern measurements may vary in the range of 0.1 to 1.0 nm, 1.0 to 10 nm, or 10 to 100 nm or in the range of 0.1 nm or less or in the range of 100 nm or more. The method of calculating the calculation measurements and the calculation areas and the method of generating the database are similar to those discussed above with respect to FIG. 1 and thus, a description thereof will be omitted here in the interest of brevity.

In operations of block S140, an actual pattern is formed using the design pattern. The actual pattern may be one of a photoresist pattern, a hard mask pattern, and an aerial image emulating pattern. Since the photoresist pattern, the hard mask pattern, and the aerial image emulating pattern are similar to those discussed above, a description thereof will be omitted here in the interest of brevity.

In operations of block S150, the area of the actual pattern is measured. In operations of block S160, a calculation area corresponding to the area of the actual pattern is selected from the database, and calculation measurements corresponding to the calculation area are selected. During the operation of selecting the calculation area (block S160), a calculation area that is the most approximate to the area of the actual pattern may be selected. In operations of block S70, a difference between the design pattern measurements and the calculation measurements is calculated and set as an MTT.

Thereafter, the design patterns of the application photomask layout are corrected using the MTT, thereby forming a correction photomask layout in operations of block S180. For example, when a first design pattern measure is 800, a second design pattern measure is 200, and the measured area of the actual pattern is 121600, an MTT is 40. Thus, a first corrected design pattern measurement obtained by adding 40 to 800 is 840, and a second corrected design pattern measurement obtained by adding 40 to 200 is 240.

Furthermore, operations of block S110 may include the operations described with reference to FIG. 2. In these embodiments, operations of blocks S12, S14, and S16 illustrated in FIG. 2 correspond to operations S112, S114, and S116, respectively. Specifically, operations of block S110 of providing at least one design pattern may include operations of block S112 of providing an initial design pattern, operations of block S114 of separating the initial design pattern into a plurality of temporary design patterns having a shape including a triangular shape, a rectangular shape, a square shape, a parallelogram shape, a lozenge shape, a trapezoidal shape, a semicircular shape, a circular shape, an elliptical shape or any combination thereof, and operations of block S116 of selecting and providing a design pattern from one of the plurality of temporary design patterns. Furthermore, in operations of block S116, a temporary design pattern having the largest area may be selected out of the plurality of temporary design patterns as the design pattern. Thus, an MTT may be approximately obtained using even a design pattern with a complicated shape.

Figure 4:
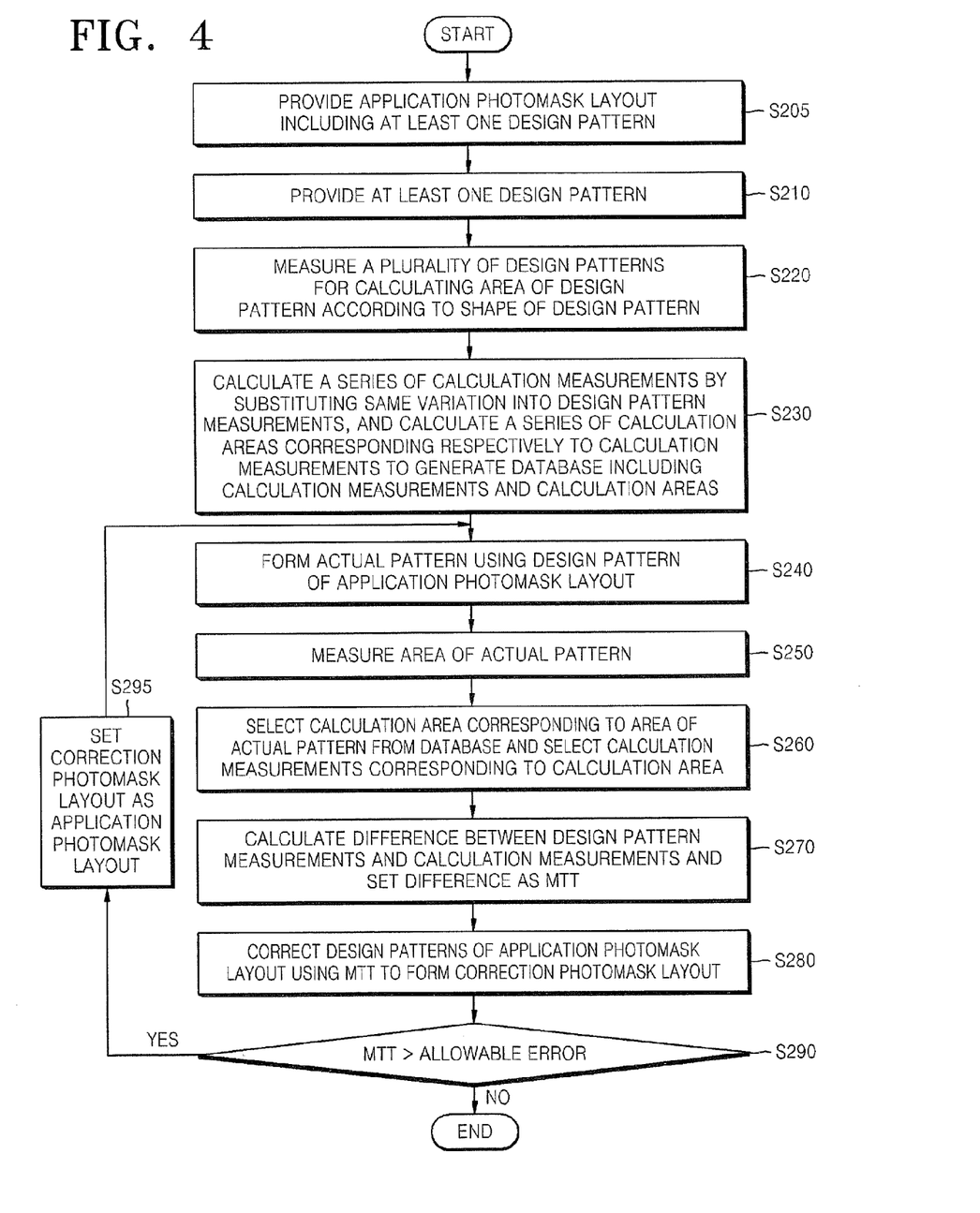
FIG. 4 a flowchart illustrating methods of correcting a photomask according to some embodiments of the present invention.

Referring now to FIG. 4, a flowchart illustrating methods of correcting a photomask according to some embodiments of the present invention will be discussed. Unlike in the previous embodiment in which a photomask correction operation is performed once after an MTT is set, in embodiments of the present invention illustrated in FIG. 4 a photomask correction operation is performed several times. Thus, operations of blocks S205 through S280 correspond respectively to operations of blocks S105 through S180 discussed above with respect to FIG. 3. Furthermore, operations of block S12 through S16 illustrated in FIG. 2 are similar to operations of blocks S212, 214, and 216 of FIG. 4, thus, a description of the same operations will be omitted here in the interest of brevity.

As discussed above with respect to FIG. 3, after operations of block S280 in which a correction photomask layout is formed using a set MTT, the MTT is compared with an allowable error in operations of block S290. In these embodiments, the allowable error may be a tolerance of a pattern formed using a photomask and a permitted limit of the allowable error may vary according to the type of a semiconductor microdevice. For example, the permitted limit may be set in the range from about 1.0 to about 10 nm or from about −10.0 to about −1.0 nm. It will be understood that these limits are provided as examples only and, therefore, embodiments of the present invention are not limited thereto. In other words, the limit may be set in the range of 0.1 to 1.0 nm, the range of −1.0 to −0.1 nm, the range of 10 to 100 nm, or the range of −10 to 100 nm without departing from the scope of the present invention. Alternatively, the limit may be set in the range of ±0.1 nm or less or the range of ±100 nm or more.

When the MTT is within the limit, the correction photomask layout is selected as a final layout. However, when the MTT is outside the limit, the correction photomask layout is selected as an application photomask layout in operations of block S295. Thereafter, operations of block S240 of forming an actual pattern using a design pattern of the application photomask layout through operations of block S290 of comparing an MTT with an allowable error are repeated until the set MTT is within the permitted limit. During repetition of operations of blocks S240 through S290, a difference between the design pattern and an actual pattern formed on a substrate can be further reduced. Furthermore, the above-described aerial image emulating pattern formed using an aerial image emulator is more suited to repeat operations S240 to S290.

Figure 5:
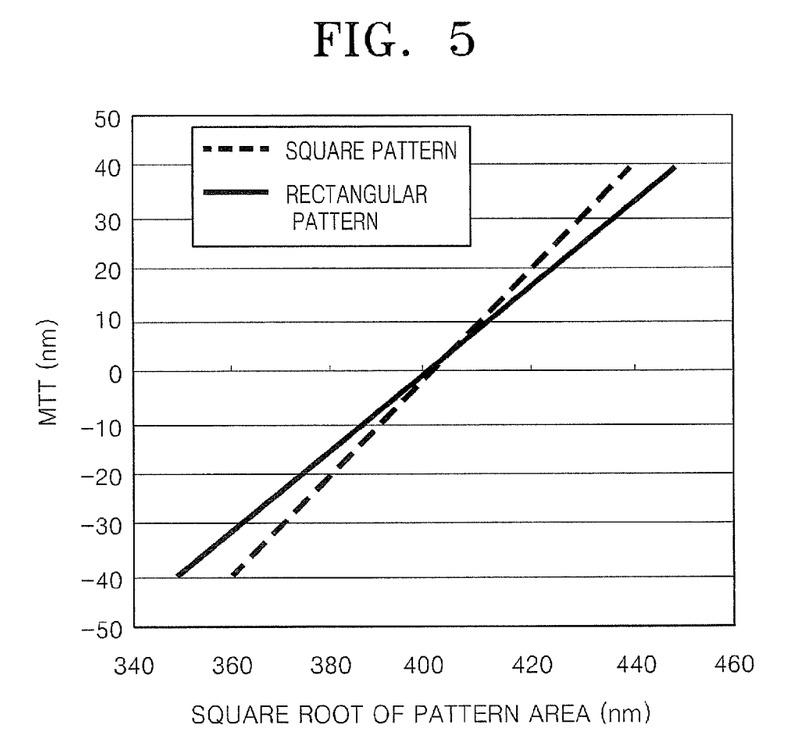
FIG. 5 is a graph illustrating a difference in an MTT according to a pattern shape according to some embodiments of the present invention.

Referring now to FIG. 5, a graph illustrating a difference in an MTT according to a pattern shape in accordance with some embodiments of the present invention will be discussed. As illustrated in FIG. 5, it is assumed that a design pattern is a square pattern of which each side is 400 nm long. The length of the sides of the square pattern corresponds to the above-described design pattern measurement. Thus, the square pattern has an area of about 160,000 $nm^2$. Furthermore, it is assumed that an actual pattern formed using the square pattern has an area of 129,600 $nm^2$. In order to obtain an MTT of the square pattern, the square root of the area of the actual pattern is found and compared with the length of each of the sides of the design pattern. Since the square root of the area of the actual pattern is 360 nm, 360 nm is subtracted from 400 nm to leave an MTT of 40 nm.

In some embodiments of the present invention, it is assumed that a design pattern is a rectangular pattern having a width of 800 nm and a length of 200 nm. The width and length of the rectangular pattern correspond to the above-described design pattern measurements. Thus, the rectangular pattern has an area of 160,000 $nm^2$, which is equal to the area of the foregoing square pattern. Similarly, it is assumed that an actual pattern formed using the rectangular pattern has an area of 129,600 $nm^2$. If the MTT obtained using the above-described square pattern is substituted, corrected design pattern measurements may be 760 nm and 160 nm, respectively, and the area of the design pattern may be 121,600 $nm^2$, so that the area of the actual pattern cannot be embodied. However, based on the database shown in Table 1, the corrected design pattern measurements may be 769 nm and 169 nm, respectively, so that an MTT may be 31 nm.

According to some embodiments of the present invention, an MTT can be measured more precisely, so that a photomask can be corrected more precisely and a desired pattern can be substantially transferred on a substrate.

Figure 6:
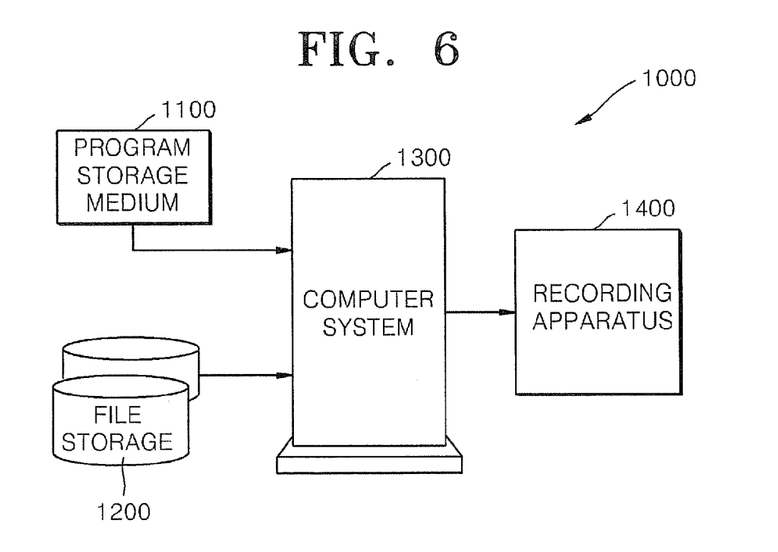
FIG. 6 is a schematic diagram illustrating an image system for executing a method of measuring an MTT and a method of correcting a photomask according to some embodiments of the present invention.

Referring now to FIG. 6, a schematic diagram of an image system 1000 for executing methods of measuring an MTT and methods of correcting a photomask according to some embodiments of the present invention will be discussed. As illustrated in FIG. 6, a computer system 1300 for executing a method of measuring an MTT and a method of correcting a photomask may be a general-use workstation. The computer system 1300 may be a stand-alone type or a network type. The computer system 1300 may include a single processor or multiprocessor for calculations. Furthermore, the computer system 1300 may be a parallel-processing computer system.

The computer system 1300 executes a series of executable commands, which are written in a program storage medium 1100, for example, a compact disk (CD) or a digital video disk (DVD), or received via wired/wireless communication networks, such as the Internet. The computer system 1300 receives a file including information on design patterns or photomask layouts from a database on design patterns or a photomask layout file storage 1200, for example, a database or any other storage medium, and executes a command to read the file. The computer system 1300 performs a process of measuring an MTT or a process of correcting a photomask using the measured MTT according to some embodiments of the present invention on a design pattern or a photomask layout and generates a file including information on the performed process.

Thereafter, the computer system 1300 performs a comparison/inspection process to check if a desired photomask layout is formed, and transmits the photomask layout to a mask recording apparatus 1400 to enable the manufacture of a photomask or a reticle.

As discussed above, some embodiments of the present invention may be embodied as computer readable codes on a computer readable recording medium. The computer readable recording medium may be any data storage device that can store programs or data, which can be thereafter read by a computer system. Examples of the computer readable recording medium include read-only memories (ROMs), random-access memories (RAMs), CD-ROMs, DVDs, magnetic tapes, hard disks, floppy disks, flash memory, optical data storage devices, and carrier waves, such as data transmission through the Internet. Here, a program stored in a recording medium is expressed in a series of instructions used directly or indirectly within a device with a data processing capability, such as, computers. Thus, a term "computer" involves all devices with data processing capability in which a particular function is performed according to a program using a memory, input/output devices, and arithmetic logics.

According to some embodiments of the present invention as described above, a 1-dimensional MTT can be measured using the area of a 2-dimensional pattern, and a photomask layout can be corrected using the measured MTT.

Furthermore, since an MTT can be measured using the area of a pattern, even if the linewidth of patterns is reduced, inaccuracy of the MTT due to an optical proximity effect can be prevented, thereby enabling precise manufacture of a photomask layout. As a result, a desired pattern can be more precisely transferred on a substrate.

Furthermore, according to some embodiments of the present invention, an MTT of a pattern having a complicated shape can be easily measured, and a photomask layout can be easily corrected using the measured MTT.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of measuring a mean-to-target (MTT) based on pattern area measurements, the method comprising:
    providing a design pattern;
    measuring a plurality of the design pattern measurements for calculating an area of the design pattern based on a shape of the design pattern;
    calculating a series of calculation measurements by continuously substituting a same variation into the plurality of the design pattern measurements, and calculating a series of calculation areas corresponding respectively to each of the series of calculation measurements to generate a database including the calculation measurements and the calculation areas;
    forming an actual pattern using the design pattern;
    measuring an area of the actual pattern;
    selecting a calculation area from the series calculation areas, corresponding to the area of the actual pattern, from the database and selecting calculation measurements from the series calculation measurements corresponding to the selected calculation area; and
    calculating a difference between the plurality of the design pattern measurements and the selected calculation measurements and setting the difference as an MTT, wherein the providing, measuring, calculating, forming, measuring, selecting and calculating are performed on at least one processor.

2. The method of claim 1, wherein calculating the series of calculation measurements comprises continuously increasing or decreasing all the design pattern measurements at the same variation.

3. The method of claim 2, wherein the variation and a range of the variation are determined according to a grid of the design pattern.

4. The method of claim 1, wherein selecting the calculation area comprises selecting a calculation area that is most approximate to the area of the actual pattern.

5. The method of claim 1, wherein the design pattern comprises a polygonal shape and/or a curved surface shape.

6. The method of claim 5, wherein the design pattern comprises a triangular shape, a rectangular shape, a square shape, a parallelogram shape, a lozenge shape, a trapezoidal shape, a semicircular shape, a circular shape and/or an elliptical shape.

7. The method of claim 1, wherein providing the design pattern comprises:
    providing an initial design pattern;
    separating the initial design pattern into a plurality of temporary design patterns, each temporary design pattern including a triangular shape, a rectangular shape, a square shape, a parallelogram shape, a lozenge shape, a trapezoidal shape, a semicircular shape, a circular shape and/or an elliptical shape; and
    selecting one of the plurality of temporary design patterns as the design pattern.

8. The method of claim 7, wherein selecting one of the plurality of temporary design patterns as the design pattern comprises selecting a temporary design pattern having a largest area as the design pattern.

9. The method of claim 1, wherein the actual pattern comprises a photoresist pattern, a hard mask pattern and/or an aerial image emulating pattern.

10. A method of correcting a photomask, the method comprising:
providing an application photomask layout including at least one design pattern;
providing the at least one design pattern;
measuring a plurality of the design pattern measurements for calculating an area of the design pattern according to a shape of the design pattern;
calculating a series of calculation measurements by continuously substituting a same variation into the plurality of the design pattern measurements, and calculating a series of calculation areas corresponding respectively to each of the series of calculation measurements to generate a database including the calculation measurements and the calculation areas;
forming an actual pattern using the design pattern of the application photomask layout;
measuring the area of the actual pattern;
selecting a calculation area from the series calculation areas, corresponding to the area of the actual pattern from the database and selecting calculation measurements from the series calculation measurements corresponding to the selected calculation area;
calculating a difference between the plurality of the design pattern measurements and the selected calculation measurements and setting the difference as an MTT; and
correcting the design patterns of the application photomask using the MTT to form a correction photomask layout, wherein the providing an application, providing the at least one design pattern, measuring, calculating, forming, measuring, selecting, calculating and correcting are performed on at least one processor.

11. The method of claim 10, wherein the MTT is greater than an allowable error, the method further comprises:
setting the correction photomask layout as the application photomask layout after forming the correction photomask layout; and
repeating forming the actual pattern, measuring the area of the actual pattern, selecting the calculation area and selecting the calculation measurements, calculating the difference between the design pattern measurements and the calculation measurements and setting the difference as the MTT, and forming the correction photomask layout.

12. The method of claim 11, wherein the allowable error is from a range from −100 nm to 100 nm.

13. The method of claim 10, wherein calculating the series of calculation measurements is performed by continuously increasing or decreasing all the design pattern measurements at a same variation.

14. The method of claim 13, wherein the variation and a range of the variation are determined according to a grid of the design pattern.

15. The method of claim 10, wherein selecting the calculation area comprises selecting a calculation area that is most approximate to the area of the actual pattern.

16. The method of claim 10, wherein the design pattern comprises a polygonal shape and/or a curved surface shape.

17. The method of claim 16, wherein the design pattern comprises a triangular shape, a rectangular shape, a square shape, a parallelogram shape, a lozenge shape, a trapezoidal shape, a semicircular shape, a circular shape and/or an elliptical shape.

18. The method of claim 10, wherein providing the design pattern comprises:
providing an initial design pattern;
separating the initial design pattern into a plurality of temporary design patterns, each temporary design pattern including a triangular shape, a rectangular shape, a square shape, a parallelogram shape, a lozenge shape, a trapezoidal shape, a semicircular shape, a circular shape and/or an elliptical shape; and
selecting one of the plurality of temporary design patterns as the design pattern.

19. The method of claim 18, wherein selecting one of the plurality of temporary design patterns as the design pattern comprises selecting a temporary design pattern having a largest area as the design pattern.

20. The method of claim 10, wherein the actual pattern comprises a photoresist pattern, a hard mask pattern, and/or an aerial image emulating pattern.

* * * * *